(12) United States Patent
McBride

(10) Patent No.: US 6,480,987 B1
(45) Date of Patent: Nov. 12, 2002

(54) METHOD AND SYSTEM FOR ESTIMATING CAPACITIVE COUPLING IN A HIERARCHICAL DESIGN

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/494,749

(22) Filed: Jan. 31, 2000

(51) Int. Cl.[7] .............................................. G06F 17/50
(52) U.S. Cl. .............................................. 716/5; 716/4
(58) Field of Search ........................................ 716/1–14

(56) References Cited

U.S. PATENT DOCUMENTS

| | | | | |
|---|---|---|---|---|
| 5,535,133 A | * | 7/1996 | Petschauer et al. | 716/19 |
| 5,555,506 A | * | 9/1996 | Petschauer et al. | 703/13 |
| 5,568,395 A | * | 10/1996 | Huang | 716/4 |
| 5,596,506 A | * | 1/1997 | Petschauer et al. | 716/5 |
| 5,923,565 A | * | 7/1999 | Smith et al. | 364/489 |
| 5,923,568 A | * | 7/1999 | Oh et al. | 364/490 |

OTHER PUBLICATIONS

"Cubic Ware: A Hierarchical Design System for Deep Sub-micron ASIC", Myung–Soo Jang, et al., Feb. 1999, ASIC/SOC Conference Proceedings, 12th IEEE International, pp. 168–172.*

Basic Electricity, 1962, Bureau of Naval Personnel, Dover Publications, Inc., p. 156.*

* cited by examiner

Primary Examiner—Vuthe Siek
Assistant Examiner—Sun James Lin

(57) ABSTRACT

A coupling capacitance analysis logic allows the classification of capacitance in a hierarchical electronic design. The coupling capacitance analysis logic analyzes capacitance between signal lines and other signal lines, and analyzes capacitance between signal lines and the substrate on which the circuitry resides, between signal lines and transistor gates, and between signal lines and diffusion regions. Capacitances associated with child blocks within the hierarchical design are first analyzed and then brought up into higher levels of the design without the need to repeat the analysis performed in the lower level. In this manner, a complex hierarchical design may be effectively and efficiently analyzed. Once the design analysis is complete, the logic of the invention determines the amount of coupling capacitance attributable to each signal in the design with respect to each subject signal. Each signal will be analyzed as the subject signal and each signal affecting the subject signal will be a culprit signal. For each subject signal, the weighted average of all culprit signals is determined by multiplying the rise and fall times of each culprit signal by the coupling capacitance attributable to that culprit signal. This is performed for each culprit signal affecting the subject signal. The total is then divided by the total coupling capacitance between the subject signal and all culprit signals, resulting in the weighted average of all culprit signals affecting the subject signal. All signals in the design are analyzed as the subject signal.

15 Claims, 4 Drawing Sheets

METHOD AND SYSTEM FOR ESTIMATING CAPACITIVE COUPLING IN A HIERARCHICAL DESIGN

TECHNICAL FIELD

The present invention relates generally to electronic device testing and verification, and, more particularly, to a method and system for estimating capacitive coupling between signals in a hierarchical design.

BACKGROUND OF THE INVENTION

In integrated circuits, wiring boards, or any electronic circuitry, there is a capacitance between signal lines and other signal lines, and between signal lines and ground. The capacitance between signal lines and ground is sometimes referred to as "good" capacitance as it reduces cross-talk between signal lines. This good capacitance may exist between signal lines and the substrate upon which the circuitry is formed, between signal lines and transistor gates, and between signal lines and diffusion regions. Cross-talk can be thought of as interference to a signal imparted to that signal by a signal coupled to it from another conductor.

The capacitance between signal lines and other signal lines is sometimes referred to as "bad" capacitance. This bad capacitance capacitively couples signals on respective wires and increases the likelihood of cross-talk between the capacitively coupled signal wires. Some signal to signal capacitance can be considered good capacitance, if, for example, it does not add significantly to the worst case noise event on the subject signal.

During the design and testing of electronic circuitry, it is desirable to have the ability to determine the total capacitance affecting each signal in the design and the ability to distinguish between capacitance to ground and coupling capacitance between signals. The total capacitance is the total of the good capacitance (between the subject signal and ground) and the bad capacitance (between the subject signal and other signals capacitively coupled to the subject signal). In particular, it is important to know the bad capacitance (capacitive coupling) affecting each signal in the design.

One manner to determine the capacitive coupling onto each signal in a design is to consider each of the aggressor signals individually, so that each victim is analyzed multiple times for the effects of capacitive coupling. As used in this document, a signal is considered a victim when it is being analyzed to determine the signals (aggressors) that are capacitively coupled to the victim. This requires that these multiple analyses be combined in some way to demonstrate that there is not a problem with capacitive coupling in the design. Unfortunately, this approach is inefficient and consumes valuable processing resources.

Another manner in which to determine the capacitive coupling onto each signal in a design is to decide, at the child level of the design, whether an aggressor presents good capacitance or bad capacitance to the victim, instead of at the top level of the design. A design may have a number of child levels that are included in a parent level of the design. Unfortunately, this approach ignores the additive effects of each child group in the design and the parent.

Yet another manner in which to determine the capacitive coupling onto each signal in a design is to extract each capacitance in the design and consider each extracted capacitor individually for the good capacitance/bad capacitance determination. This should be done without adding the entire capacitance between an aggressor and its victim. Unfortunately, because typical capacitor extraction programs do not combine the capacitances in a single level, let alone across a hierarchy, this approach ignores the total capacitance between signals, in the good capacitance/bad capacitance determination.

Therefore, a need exists for an efficient, simple way to determine total capacitance in an electronic design, and to distinguish between capacitance to ground (good capacitance) and capacitive coupling (bad capacitance) to other signals.

SUMMARY OF THE INVENTION

The invention provides a system and method for estimating capacitive coupling between signals in a hierarchical design.

The present invention may be conceptualized as a method for estimating capacitive coupling in a hierarchical design. The method comprises the steps of providing a circuit having a first level and a second level, providing a first signal in the circuit, providing at least one additional signal in the circuit, the additional signal coupled to the first signal, determining a coupling capacitance between the first signal and the additional signal, the coupling capacitance determined with respect to the first level, resulting in a first level coupling capacitance, and with respect to the second level, resulting in a second level coupling capacitance, and adding the first level coupling capacitance to the second level coupling capacitance to determine a total coupling capacitance between the first signal and the additional signal.

Architecturally, the present invention can be conceptualized as a system for estimating capacitive coupling in a hierarchical design, comprising a circuit having a first level and a second level, a first signal associated with the circuit, at least one additional signal associated with the circuit, the additional signal coupled to the first signal, logic configured to determine a coupling capacitance between the first signal and the additional signal, the coupling capacitance determined with respect to the first level, resulting in a first level coupling capacitance, and with respect to the second level, resulting in a second level coupling capacitance, and logic configured to add the first level coupling capacitance to the second level coupling capacitance to determine a total coupling capacitance between the first signal and the additional signal.

The invention has numerous advantages, a few of which are delineated, hereafter, as merely examples.

An advantage of the invention is that it quickly and efficiently determines the total capacitance in a hierarchical design.

Another advantage of the invention is that it determines between effective capacitance to ground and relevant coupling capacitance to other signals in the design.

Another advantage of the invention is that it can determine the weighted average of the rise or fall times of all signals capacitively coupled to a subject signal.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings.

DETAILED DESCRIPTION OF THE PREFERRED EMBODIMENT

The coupling capacitance analysis logic of the present invention can be implemented in software, hardware, or a combination thereof. In a preferred embodiment(s), the coupling capacitance analysis logic is implemented in software or firmware that is stored in a memory and that is executed by a suitable instruction execution system (microprocessor). If implemented in hardware, as in an alternative embodiment, the coupling capacitance analysis logic can be implemented with any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the coupling capacitance analysis software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Moreover, while the capacitive coupling analysis logic will be illustrated hereafter with respect to the analysis of capacitive coupling in an integrated circuit, the capacitive coupling analysis logic is equally applicable to analyzing other types of circuits, including but not limited to, circuit and wiring boards.

Figure 1:
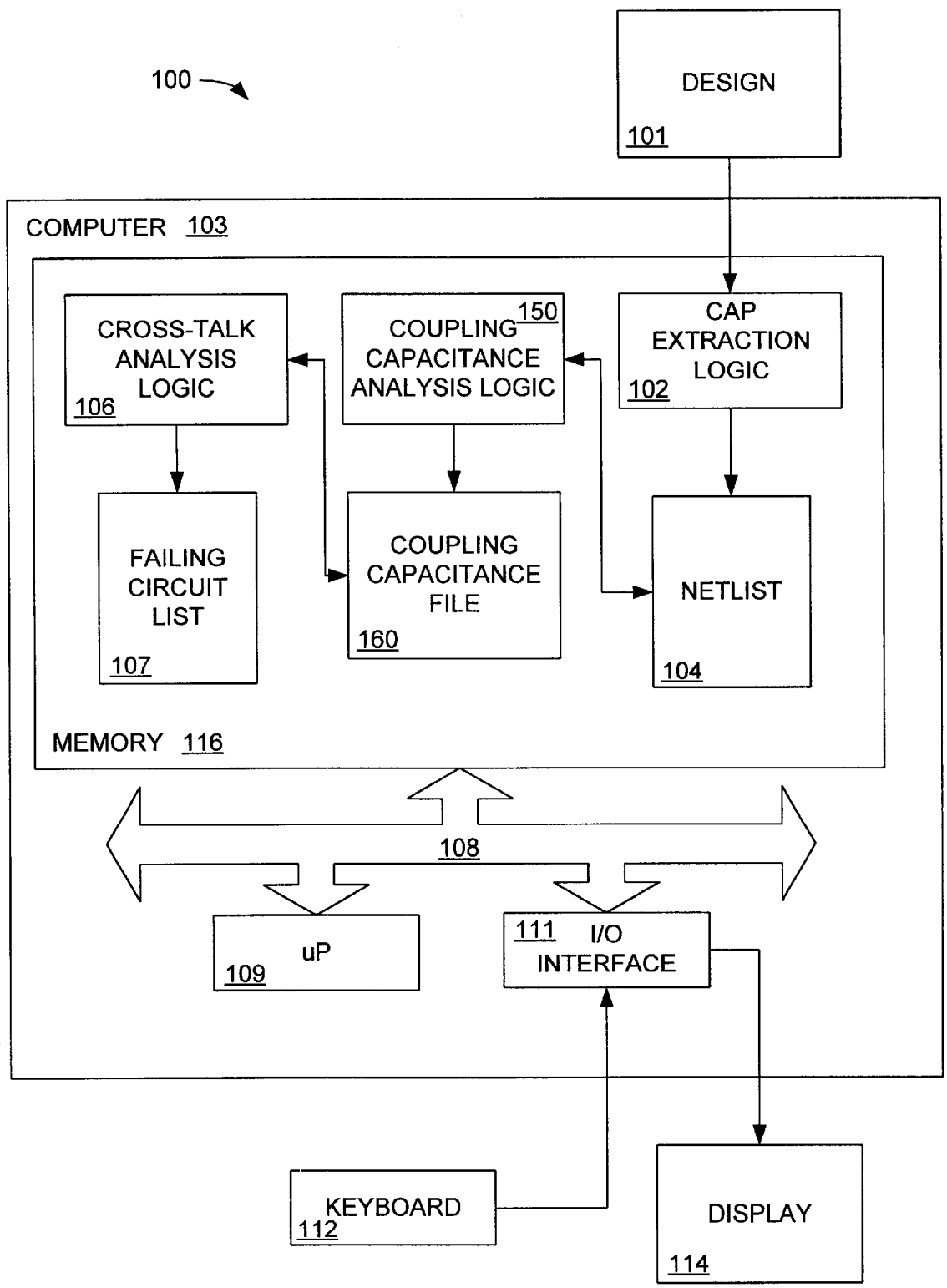
FIG. 1 is a schematic view of an exemplar computer system in which the capacitive coupling analysis logic of the present invention resides.

Turning now to the drawings, FIG. 1 is a block diagram 100 including a computer 103 in which the coupling capacitance analysis logic 150 of the invention resides. Computer 103 can be an individual computer workstation or can be one of a number of networked computer workstations that communicates with other computer workstations and servers over a network (not shown). It should be understood that while the coupling capacitance analysis logic 150 of the invention will be described as executing on computer 103, the coupling capacitance analysis logic 150 could execute on a computer remote from computer 103.

Design block 101 represents an integrated circuit design, but can also represent a circuit board design. Design block 101 can be any electronic design in which it is desirable to identify the capacitance between signal lines, and the capacitance between signal lines and other elements of the design, such as, for example but not limited to, the substrate on which the circuitry resides, transistor gates, and diffusion regions.

Computer 103 includes memory 116, which communicates over logical interface 108 with microprocessor 109 and input/output (I/O) interface 111. Microprocessor 109 and I/O interface 111 are typical components within computer 103 that will be known to those skilled in the art. I/O interface 111 receives inputs from keyboard 112 and supplies outputs to a user over display 114. Microprocessor 109 is the computer system processor on which the coupling capacitance analysis logic 150 executes.

Memory 116 includes capacitor extraction logic 102, coupling capacitance analysis logic 150 and cross-talk analysis logic 106. Memory 116 also includes a number of files that are used by the above-described logic elements while performing the steps of the invention. Memory 116 includes netlist 104, coupling capacitance file 160 and failing circuit list 107. Although shown as residing in memory 116, the logic of the invention, as mentioned above, typically executes in microprocessor 109. Furthermore, as stated above, the coupling capacitance analysis logic 150 of the invention may reside in a networked computer arrangement. In such an arrangement, design 101 might be performed on a computer different than the computer on which coupling capacitance analysis logic 150 executes. All such variations are included herein.

Capacitor extraction logic 102 operates on design 101, resulting in the creation of a netlist 104. Netlist 104 is a detailed hierarchical listing of all the signals and capacitances present within design 101. As mentioned above, the capacitances within the various signals in design 101 include capacitance between individual signal lines and other signal lines, this being known as capacitive coupling between the signal wires, and also includes capacitance between signal lines and the substrate, capacitance between signal lines and transistor gates, and capacitance between signal lines and diffusion regions. All capacitance except the coupling capacitance between signal lines is known as good capacitance. The good capacitance typically exists between the signal lines and ground, and therefore tends to reduce cross-talk between signals. However, some culprit signals may be determined to contribute good capacitance. This occurs if the coupling capacitance analysis logic 150 determines that they do not contribute significantly to the worst case noise event for a subject signal under analysis. The capacitive coupling that occurs between individual signal lines and other signal lines generally tends to cause and promote cross-talk between signals, and therefore, is know as "bad capacitance."

In accordance with an aspect of the invention, coupling capacitance analysis logic 150 analyzes all the capacitances related to all signal lines captured in netlist 104. Starting at the lowest hierarchical level of the fully distributed capacitance netlist 104, coupling capacitance analysis logic 150 analyzes all the capacitors at each level of the design and keeps a running total of the capacitance between each signal (the subject signal, or victim) and each signal (the culprit, or aggressor) that couples to the subject signal. As used herein, the term "capacitors" is used to denote capacitance values associated with the signals. This hierarchical design analysis, which includes the analysis of child blocks within the design, will be more fully described with respect to FIG. 2.

When all of the capacitors in a particular level of the design 101 have been identified and each subject signal has a list of coupling capacitance and signals coupling to it, then the analysis proceeds to the next higher level in the design. At the next level, the capacitance contained in the lower level block will be added to the next level block.

When analysis of the signals in netlist 104 is complete, coupling capacitance analysis logic 150 will have determined all of the capacitance present in design 101. Coupling capacitance analysis logic 150 will then determine, from the total capacitance, what percentage of the total capacitance is coupling capacitance (bad capacitance) and what percentage of the capacitance is capacitance that is lumped to ground (good capacitance). The coupling capacitance for each subject signal will be placed in coupling capacitance file 160. The determination of whether a capacitance is a coupling capacitance or a lumped to ground capacitance can be done in a number of ways and will be described in greater detail with respect to FIG. 3B. In accordance with an aspect of the invention, all the capacitance values identified between two signals are summed and represented as a single capacitance between two signals in the data model. The data model is the result of the circuit analysis. In this manner, the processing resource required to analyze all signals in the design is greatly reduced.

After the coupling capacitance file 160 is complete, cross-talk analysis logic 106 determines which signals in the design will have noise events significant enough to disrupt circuit operation. In accordance with an aspect of the invention, each signal is affected by every other signal. In other words, for purposes of analysis, each signal is analyzed as the subject signal, and each signal affects all signals coupled to it. For simplicity, when a signal is analyzed to determine the other signals' effect upon it, the subject signal is considered a "victim" and each signal affecting the subject signal is called a "culprit", or an "aggressor". When considered a victim, a signal has coupling capacitance to any number of culprit signals. When considered a culprit signal, the culprit signal negatively effects each victim.

In accordance with another aspect of the invention, a weighted average of the rise and fall times of all culprit signals that affect each victim is also calculated. In this manner, the rise and fall time of each culprit signal is calculated and multiplied by the coupling capacitance between that culprit signal and the victim. In short, the coupling capacitance values between a victim and each culprit are all added together resulting in the total capacitative coupling value for that victim. Then, the rise and fall times of each culprit signal is multiplied by the total coupling capacitance value, resulting in a weighted average representing the average rise and fall times of all culprit signals affecting that victim. As used herein, the term "weighted average" indicates that for each culprit, the rise time is multiplied by the coupling capacitance's value to the victim and added for each culprit to that victim. The sum of this product for all the culprit signals is then divided by the total coupling capacitance value to arrive at the weighted average. The weighted averages of the fall times are similarly computed. The rise and fall times of the signals are supplied to the coupling capacitance analysis logic 150 from a timing analyzer (not shown).

Cross-talk analysis logic 106 determines whether a coupling capacitance value read from coupling capacitance file 160 may contribute to a failure in the design. This aspect of the invention will be described in further detail with respect to FIG. 3B.

After cross-talk analysis logic 106 analyzes all the values in coupling capacitance file 160, the cross-talk analysis logic provides a failing circuit list 107, which includes a listing for each signal in the design. For each signal in the design, the total capacitance, the percent coupling capacitance and the rise and fall times of each culprit signal for a particular subject signal are listed. In this manner, the circuit designer is provided with a listing of all signals that are potentially at risk in the design.

Alternatively, the capacitor extraction logic 102 may pass the netlist to coupling capacitance analysis logic 150 without writing it to a file, such as netlist file 104. This can be accomplished by the use of what is commonly referred to in the Unix operating system as a "pipe", or by means of an API (application programming interface). Coupling capacitance analysis logic 150 can pass the coupling capacitance information to cross-talk analysis logic 106 in similar fashion.

Figure 2:
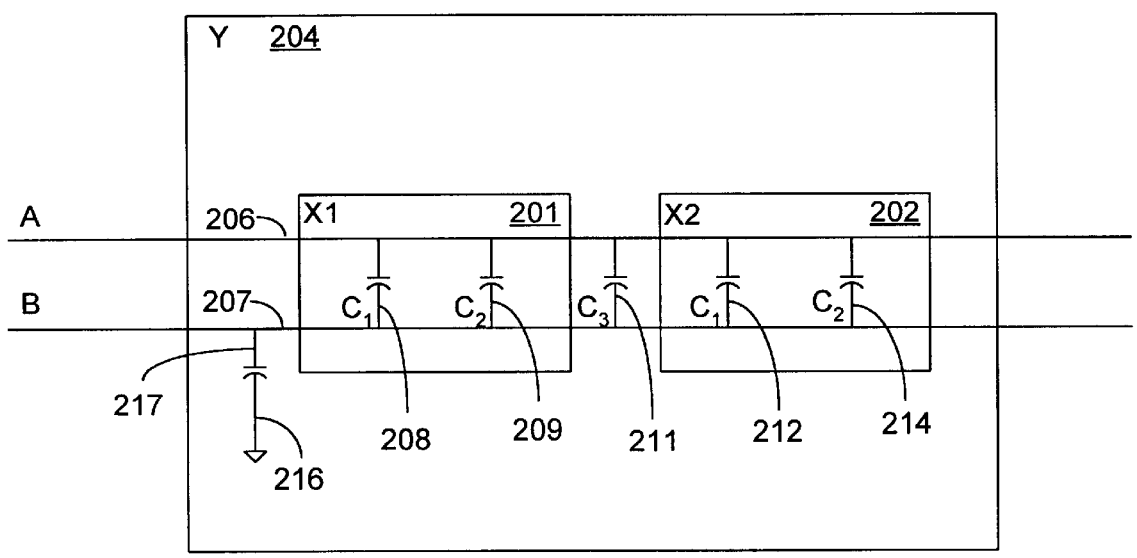
FIG. 2 is a schematic view illustrating the operation of the capacitive coupling analysis logic of FIG. 1.

FIG. 2 is a schematic illustration of an exemplar design to be analyzed by the coupling capacitance analysis logic 150 of the invention. Design 101 includes signal lines 206 and 207. Signal lines 206 and 207 pass through parent block 204, which includes child block 201 and child block 202. For simplicity, child blocks 201 and 202 are identical for this illustration, but in practice will include different capacitances and many additional connections to many additional signal lines. The coupling capacitance between signal line 206 and signal line 207 is the total capacitance between those two signal lines.

In accordance with the hierarchical design aspect of the invention, the capacitances between signal lines 206 and 207 are determined first within child block 201 and child block 202. The capacitances between signal lines 206 and 207 and within child blocks 201 and 202 are then summed up into the determination of the total capacitance with respect to parent block 204. For example, child block 201 includes capacitor 208 and capacitor 209. Child block 202 includes capacitor 212 and capacitor 214. Capacitor 211 exists within parent block 204, but is part of neither child block 201 nor child block 202. All the capacitances thus far described are coupling capacitances in that they exist between signal line 206 and signal line 207. Capacitance 217 between signal line 207 and ground 216 is considered a lumped to ground capacitance.

In accordance with the hierarchical design analysis of the invention, the total capacitance between signal line 206 and signal line 207 is C3+2(C1+C2). In this manner, the capacitances within each child block 201 and 202 are first added together and that total capacitance is then brought up and added to the capacitance C3, which capacitance is part of parent block 204 and not part of any child block, to obtain the total capacitance between signal lines 206 and 207. In order to promote the coupling capacitances through the design, each coupling capacitance has the coupling signal promoted as well. Alternatively, the instance name is added to the name of the signal buried in the child block. So, if the child block coupling signal is connected to the parent block, then the coupling capacitance is promoted to the parent and the name of the coupling signal is its name in the parent.

When all of the capacitors have been identified and each signal connecting to each of these capacitors has a coupling capacitance added to its list of coupling capacitances, then the coupling capacitance file 160 (FIG. 1) is generated by the coupling capacitance analysis logic 150 (FIG. 1). The coupling-capacitance analysis logic 150 (FIG. 1) then analyzes each capacitance for each signal and determines whether the capacitance is a coupling capacitance (i.e., one that will generate undesirable noise spikes, cross-talk, or dynamic delay in the signal), or whether the capacitance is lumped to ground (i.e. good capacitance).

Figure 3A:
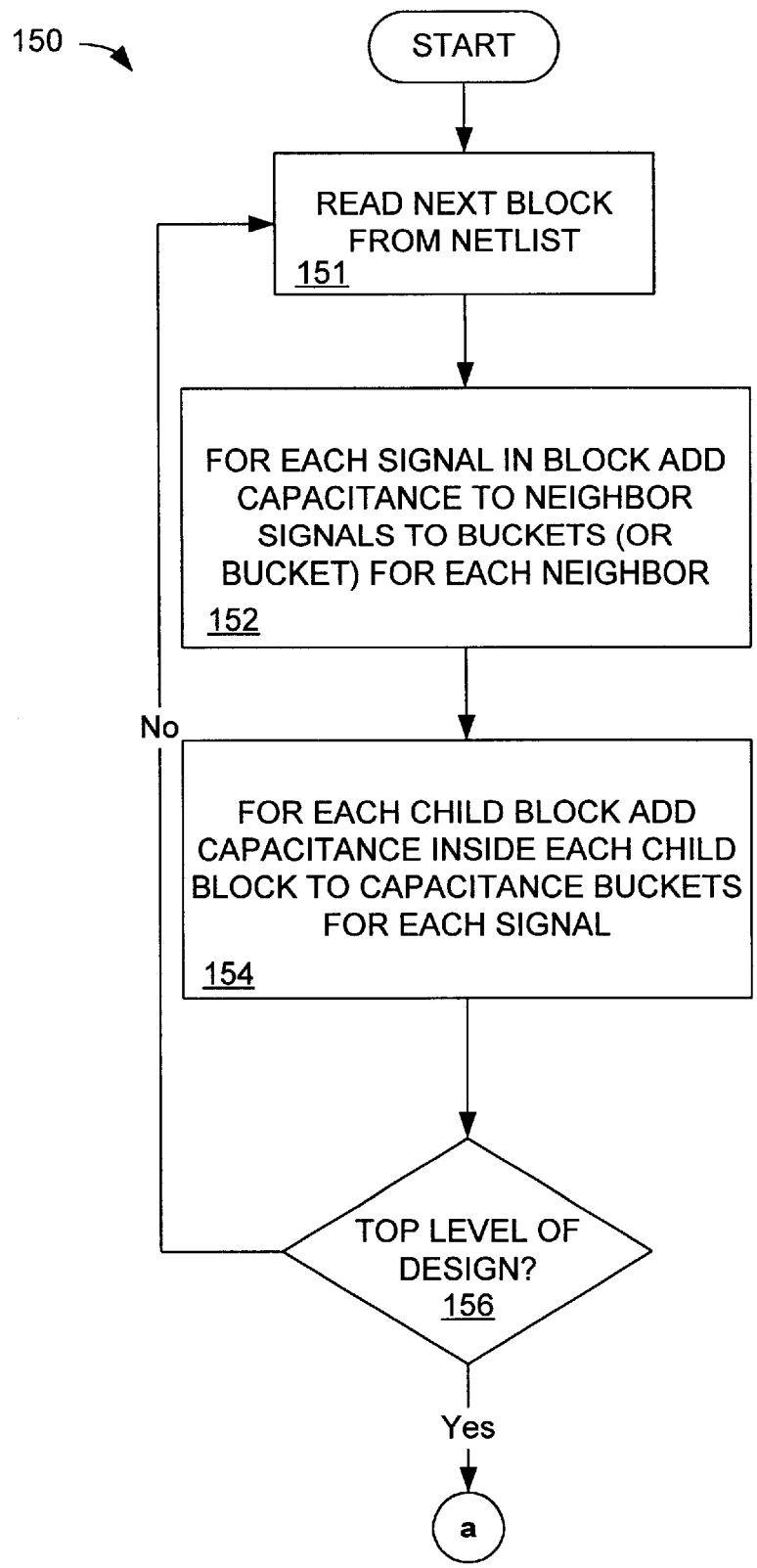
FIGS. 3A and 3B are flowcharts collectively illustrating the operation of the capacitive coupling analysis logic of FIG. 1.
Figure 3B:
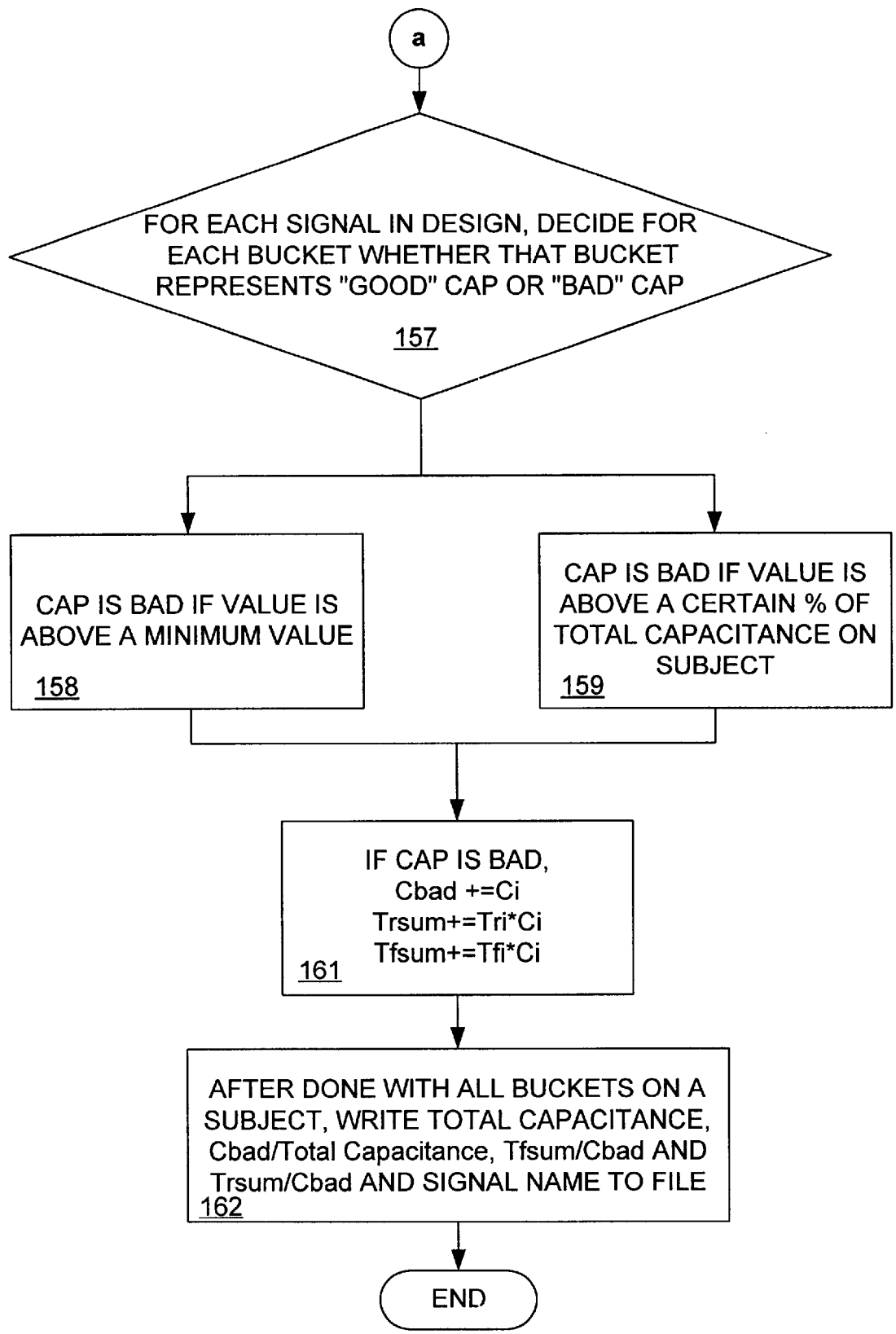

FIGS. 3A and 3B are flowcharts collectively illustrating the operation of the coupling capacitance analysis logic 150 of FIG. 1.

The flow charts of FIGS. 3A and 3B show the architecture, functionality, and operation of a possible implementation of the coupling capacitance analysis software of FIGS. 1 and 2. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3A and 3B. For example, two blocks shown in succession in FIGS. 3A and 3B may in fact be executed substantially concurrently or the blocks may sometimes be executed in the reverse order, depending upon the functionality involved, as will be further clarified hereinbelow.

With reference now to FIG. 3A, in block 151, coupling capacitance analysis logic 150 reads a next block of information from netlist 104. The capacitance extraction logic 102 places the extracted capacitances into netlist 104 in blocks of information that are analyzed sequentially by coupling capacitance analysis logic 150. In block 152, for each signal in the netlist block, the capacitance values of each neighbor signal to the subject, or victim, signal are added to buckets for the neighbor signal. A neighbor signal is one that is coupled to the subject signal through a capacitance, and may be a culprit, or aggressor. These capacitance values are stored in buckets. There is one bucket for each culprit associated with each victim. Next, in block 154, for each child block, the capacitance inside each child block of the current block from netlist 104 under analysis is added to the capacitance categories for each signal. It is important to add capacitance in child blocks to the appropriate signals in the parent block. If a victim is attached to a child block, in block 154, the coupling capacitance analysis logic 150 has to determine the proper victim signal in the child block. The coupling capacitance analysis logic 150 then maps all the buckets associated with the child block to the appropriate buckets of the parent block. To do this, coupling capacitance analysis logic 150, at block 154, either maps each bucket to a signal in the parent, for the buckets of signals that are ported to the parents, or adds the child block instance name, X1 or X2 for example (FIG. 2), to the beginning of the signal name associated with the child block. That name is promoted to a new bucket for the victim in the parent.

In block 156 it is determined whether the coupling capacitance analysis logic has completely analyzed all signals in netlist 104. If not, the process returns to block 151.

Referring now to FIG. 3B, if the coupling capacitance analysis logic 150 has completely analyzed all signals in netlist 104, then in block 157 it is determined, for each signal in the design, whether the capacitance is a coupling capacitance (i.e. a bad capacitance) or a lumped capacitance to ground (i.e. a good capacitance).

There are a number of ways in which to determine whether the capacitance is a coupling capacitance. For example, in block 158 the capacitance is deemed to be a coupling capacitance if its value is above a minimum value. Alternatively, in block 159, the capacitance is deemed to be a coupling capacitance if its value is above a certain percentage of the total capacitance on the subject signal. It should be noted that any number of ways to determine whether the capacitance is a coupling capacitance could be employed.

In block 161, if the capacitance is determined to be a coupling capacitance, then the coupling capacitance analysis logic 150 will determine the weighted average of all the culprit signals that affect the subject signal. This is done by taking the rise time and the fall time of each culprit signal and multiplying that rise and fall time by the coupling capacitance between that particular culprit signal and the subject signal. In this manner, the rise/fall time of all culprit signals are multiplied by their respective coupling capacitances and the values added together. This total is divided by the total coupling capacitance between the subject signal and all culprit signals affecting the subject signal, resulting in the weighted average of all culprit signals affecting the subject signal. The rise and fall times of the signals are supplied to the coupling capacitance analysis logic 150 from a timing analyzer (not shown).

Next in block 162, the coupling-capacitance analysis logic 150 (FIG. 1) will create the coupling capacitance file, which includes the total capacitance, the percent coupling capacitance of the total capacitance, and the rise and fall times of the culprit signals.

It will be obvious to those skilled in the art that many modifications and variations may be made to the preferred embodiments of the present invention, as set forth above, without departing substantially from the principles of the present invention. For example, the coupling capacitance analysis logic can be implemented to analyze various electronic designs including integrated circuit designs, printed wiring board designs and printed circuit designs. All such modifications and variations are intended to be included herein within the scope of the present invention, as defined in the claims that follow.

What is claimed is:

1. A method for estimating capacitive coupling in a hierarchical design, the method comprising the steps of:

providing a circuit having a first level and a second level;

providing a first signal associated with said circuit;

providing at least one additional signal associated with said circuit, said additional signal coupled to said first signal;

determining a coupling capacitance between said first signal and said additional signal, said coupling capacitance determined with respect to said first level, resulting in a first level coupling capacitance, and with respect to said second level, resulting in a second level coupling capacitance; and adding said first level coupling capacitance to said second level coupling capacitance to determine a total coupling capacitance between said first signal and said additional signal.

2. The method of claim 1, further comprising the steps of:

determining a rise time associated with each of a plurality of additional signals;

multiplying said rise time associated with each of said plurality of additional signals by a total coupling capacitance corresponding to said first signal and each of said plurality of additional signals, resulting in a weighted rise time; and adding each said weighted rise time resulting in an average rise time for all of said plurality of additional signals.

3. The method of claim 1, further comprising the steps of:

determining a fall time associated with each of a plurality of additional signals;

multiplying said fall time associated with each of said plurality of additional signals by a total coupling capacitance corresponding to said first signal and each of said plurality of additional signals, resulting in a weighted fall time; and adding each said weighted fall time resulting in an average fall time for all of said plurality of additional signals.

4. The method of claim 1, wherein said circuit is an integrated circuit.

5. The method of claim 1, wherein said circuit is a printed wiring board.

6. A system for estimating capacitive coupling in a hierarchical design, comprising:

a circuit having a first level and a second level;

a first signal associated with said circuit;

at least one additional signal associated with said circuit, said additional signal coupled to said first signal;

logic configured to determine a coupling capacitance between said first signal and said additional signal, said coupling capacitance determined with respect to said first level, resulting in a first level coupling capacitance, and with respect to said second level, resulting in a second level coupling capacitance; and logic configured to add said first level coupling capacitance to said second level coupling capacitance to determine a total coupling capacitance between said first signal and said additional signal.

7. The system of claim 6, further comprising:

a rise time associated with each of a plurality of additional signals;

logic configured to multiply said rise time associated with each of said plurality of additional signals by a total coupling capacitance corresponding to said first signal and each of said plurality of additional signals, resulting in a weighted rise time; and logic configured to add each said weighted rise time resulting in an average rise time for all of said plurality of additional signals.

8. The system of claim 6, further comprising:

a fall time associated with each of a plurality of additional signals;

logic configured to multiply said fall time associated with each of said plurality of additional signals by a total coupling capacitance corresponding to said first signal and each of said plurality of additional signals, resulting in a weighted fall time; and logic configured to add each said weighted fall time resulting in an average fall time for all of said plurality of additional signals.

9. The system of claim 6, wherein said circuit is an integrated circuit.

10. The system of claim 6, wherein said circuit is a printed wiring board.

11. A computer readable medium having a program for estimating capacitive coupling in a hierarchical design, the program comprising:

logic configured to receive a circuit having a first level and a second level;

logic configured to provide a first signal in said circuit;

logic configured to provide at least one additional signal in said circuit, said additional signal coupled to said first signal;

logic configured to determine a coupling capacitance between said first signal and said additional signal, said coupling capacitance determined with respect to said first level, resulting in a first level coupling capacitance, and with respect to said second level, resulting in a second level coupling capacitance; and logic configured to add said first level coupling capacitance to said second level coupling capacitance to determine a total coupling capacitance between said first signal and said additional signal.

12. The program of claim 11, further comprising logic configured to:

determine a rise time of each of a plurality of additional signals;

multiply said rise time of each of said plurality of additional signals by a total coupling capacitance corresponding to said first signal and each of said plurality of additional signals, resulting in a weighted rise time; and add each said weighted rise time resulting in an average rise time for all of said plurality of additional signals.

13. The program of claim 11, further comprising logic configured to:

determine a fall time of each of a plurality of additional signals;

multiply said fall time of each of said plurality of additional signals by a total coupling capacitance corresponding to said first signal and each of said plurality of additional signals, resulting in a weighted fall time; and add each said weighted fall time resulting in an average fall time for all of said plurality of additional signals.

14. The program of claim 11, wherein said circuit is an integrated circuit.

15. The program of claim 11, wherein said circuit is a printed wiring board.

* * * * *